(12) United States Patent
Tomita (10) Patent No.: US 6,927,629 B2
(45) Date of Patent: Aug. 9, 2005

(54) DIFFERENTIAL AMPLIFIER HAVING IMPROVED BALANCED AND LINEARITY

(75) Inventor: Kazuhiro Tomita, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/805,103

(22) Filed: Mar. 14, 2001

(65) Prior Publication Data

US 2002/0057132 A1 May 16, 2002

(30) Foreign Application Priority Data

Jun. 13, 2000 (JP) ........................................ 2000-176491

(51) Int. Cl.$^7$ ............................................... H03F 3/45
(52) U.S. Cl. ...................... 330/252; 330/254; 330/25; 330/277; 327/359
(58) Field of Search ............................... 330/277, 252, 330/254; 333/25; 326/78; 327/359

(56) References Cited

U.S. PATENT DOCUMENTS

| | | | |
|---|---|---|---|
| RE31,545 E | * | 3/1984 | Quinn |
| 4,945,263 A | * | 7/1990 | Estrada .................. 307/475 |
| 5,047,728 A | * | 9/1991 | Bayruns .................. 330/277 |
| 5,451,914 A | * | 9/1995 | Stengel .................. 333/25 |

FOREIGN PATENT DOCUMENTS

JP          5291850      * 11/1993     .................. 330/252

OTHER PUBLICATIONS

Smith et al. "Evolution of high–speed operational amplifier architectures" Solid–State Circuits, IEEE Journal of, vol.: 29 Issue 10, Oct. 1994 pp. 1166–1179.*

* cited by examiner

Primary Examiner—Michael B Shingleton
(74) Attorney, Agent, or Firm—Arent Fox PLLC (57) ABSTRACT

The present invention provides a differential amplifier that improves balance and signal linearity. The inventive amplifier includes first and second differential converters. The first differential converter includes a first grounded emitter amplifier and a first grounded base amplifier. The second differential converter includes a second grounded emitter amplifier and a second grounded base amplifier. A first output signal of the differential amplifier is generated by coupling a first differential output signal of the first grounded emitter amplifier and a first differential output signal of the second grounded base amplifier. A second output signal of the differential amplifier is generated by coupling a second differential output signal of the first grounded base amplifier and a second differential output signal of the second grounded emitter amplifier.

5 Claims, 5 Drawing Sheets

Fig. 9

DIFFERENTIAL AMPLIFIER HAVING IMPROVED BALANCED AND LINEARITY

BACKGROUND OF THE INVENTION

The present invention relates to a differential amplifier. More specifically, it relates to an RF differential amplifier, a differential converter provided with the differential amplifier, and a mixer provided with the differential converter.

The fields of radio communications (e.g., mobile communications) and wired communications (e.g., cable TV) have imposed a demand for excellent signal linearity (low distortion) in an RF transmitter/receiver circuit, in order to improve data transfer efficiency. To prevent interference between RF signals and highly integrated circuits, it is preferable to form a differential circuit on a printed circuit board (PCB), especially on a Radio Frequency Integrated Circuit (RFIC). The frequency mixer typically used in an integrated circuit is of the Gilbert-Cell type, which includes a differential circuit. Accordingly, an excellent linearity (low distortion) has been required also to the differential circuit.

Figure 1:
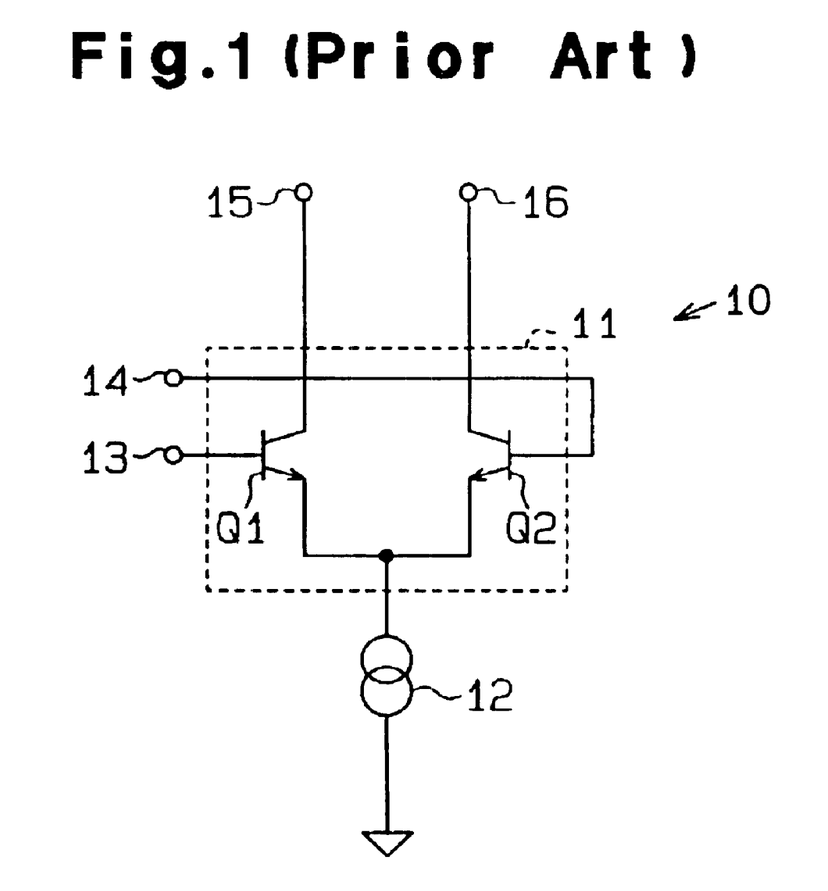
FIG. 1 is a schematic circuit diagram of a prior art differential amplifier.

FIG. 1 is a schematic circuit diagram of a prior art differential amplifier 10. The differential amplifier 10 includes an emitter-coupled differential pair 11. The differential pair 11 includes a pair of NPN transistors Q1, Q2 with the emitters connected to each other. The emitters of the NPN transistors Q1, Q2 are connected to a current source 12 that supplies a bias current. The bases of the transistors Q1, Q2 are connected to input terminals 13, 14, respectively. The collectors of the transistors Q1, Q2 are connected to output terminals 15, 16, respectively.

Since the differential amplifier 10 operates by switching the bias current, the signal linearity is limited by an inner potential of the PN junction, and its maximum output current is limited by the bias current. Therefore, the prior art circuit usually employs a method of improving the linearity at an input conversion by means of the emitter degeneration at the expenses of the gain and the noise characteristics, which are as important as the distortion characteristic. This method does not improve the linearity of the output power (output current), however.

Further, there arises a problem in the balance of the differential outputs. The problem is related to the balance of amplitudes of the differential outputs and the balance of phase errors thereof. The balance of the differential outputs is in connection with the balance of the differential input signals. The balance of the differential input signals has considerable influence on many characteristics of the differential circuit, such as the isolation characteristic and the spurious characteristic of the double balanced type Gilbert-Cell mixer, and the orthogonal accuracy in the orthogonal phase shifter comprising a differential CR network. In the case of the orthogonal phase shifter comprising the differential CR network, a spurious component produced by the distortion affects the orthogonal accuracy. And these important characteristics all have an effect on the communication system.

Moreover, in the prior art differential pair, a slight shift of the balance of the RF input signals results in an unbalance to the output signals. The differential pair is used in an input circuit of the Gilbert-Cell mixer, and is used in a differential signal buffer amplifier as well. Accordingly, it is important to improve the balance of the output signals.

Additionally, the ICs are supplied with the differential signals through a balun. The balun includes an RF laminated hybrid balun that is used in the RF circuit of a transceiver. However, the RF laminated hybrid balun has a narrow band characteristic, which makes it difficult to attain a sufficient balance.

SUMMARY OF THE INVENTION

An object of the present invention is to provide a differential amplifier that has improved balance and signal linearity.

In a first aspect of the present invention, a differential amplifier that receives first and second input signals and generates first and second output signals is provided. The differential amplifier includes first and second differential converters. The first differential converter includes a first grounded emitter amplifier that receives the first input signal and generates a first differential output signal, and a first grounded base amplifier that receives the first input signal and generates a second differential output signal. The second differential converter includes a second grounded emitter amplifier that receives the second input signal and generates a third differential output signal, and a second grounded base amplifier that receives the second input signal and generates a fourth differential output signal. The first output signal is generated by coupling the first differential output signal and the fourth differential output signal, and the second output signal is generated by coupling the second differential output signal and the third differential output signal.

In a second aspect of the present invention, a differential converter is provided. The differential converter includes an input-stage differential converter and a differential amplifier. The input-stage differential converter includes a first grounded emitter amplifier that receives an original input signal and generates a first differential input signal, and a first grounded base amplifier that receives the original input signal and generates a second differential input signal. The differential amplifier is connected to the input-stage differential converter, for receiving the first and second differential input signals and generating first and second output signals. The differential amplifier includes first and second output-stage differential converters. The first output-stage differential converter includes a second grounded emitter amplifier that receives the first differential input signal and generates a first differential output signal, and a second grounded base amplifier that receives the first differential input signal and generates a second differential output signal. The second output-stage differential converter includes a third grounded emitter amplifier that receives the second differential input signal and generates a third differential output signal, and a third grounded base amplifier that receives the second differential input signal and generates a fourth differential output signal. The first output signal is generated by coupling the first differential output signal and the fourth differential output signal, and the second output signal is generated by coupling the second differential output signal and the third differential output signal.

In a third aspect of the present invention, a mixer is provided, which mixes first and second input signals with first and second carrier signals to generate first and second mixer output signals. The mixer includes a differential amplifier that receives the first and second input signals and generates first and second output signals. The differential amplifier includes first and second differential converters. The first differential converter includes a first grounded emitter amplifier that receives the first input signal and generates a first differential output signal, and a first grounded base amplifier that receives the first input signal and generates a second differential output signal. The second differential converter includes a second grounded emitter amplifier that receives the second input signal and generates a third differential output signal, and a second grounded base amplifier that receives the second input signal and generates a fourth differential output signal. The first output signal is generated by coupling the first differential output signal and the fourth differential output signal, and the second output signal is generated by coupling the second differential output signal and the third differential output signal. The mixer also includes a pair of differential circuits connected to the differential amplifier, for receiving the first and second output signals and the first and second carrier signals to generate the first and second mixer output signals.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may be best understood by reference to the description of the following embodiments together with the accompanying drawings in which.

DETAILED DESCRIPTION OF THE PREFERRED EMBODIMENTS

In the drawings, like numerals are used for like elements throughout.

Figure 2:
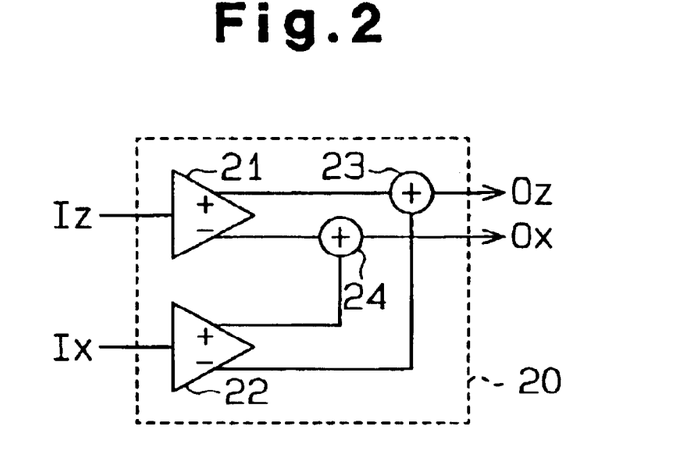
FIG. 2 is a schematic diagram of a differential amplifier according to a first embodiment of the present invention.

As shown in FIG. 2, a differential amplifier 20 according to a first embodiment of the present invention includes first and second single-end differential converters 21, 22, and first and second adders 23, 24. The first and second single-end differential converters 21, 22 respectively receive first and second input signals Iz, Ix that are complementary. Differential outputs of the first differential converter 21 are cross-coupled to those of the second differential converter 22 by the first and second adders 23, 24 to produce complementary output signals Oz, Ox.

Specifically, a non-inverted output terminal of the first differential converter 21 and an inverted output terminal of the second differential converter 22 are connected to the first adder 23, which outputs the first output signal Oz. An inverted output terminal of the first differential converter 21 and a non-inverted output terminal of the second differential converter 22 are connected to the second adder 24, which outputs the first output signal Ox.

Figure 3:
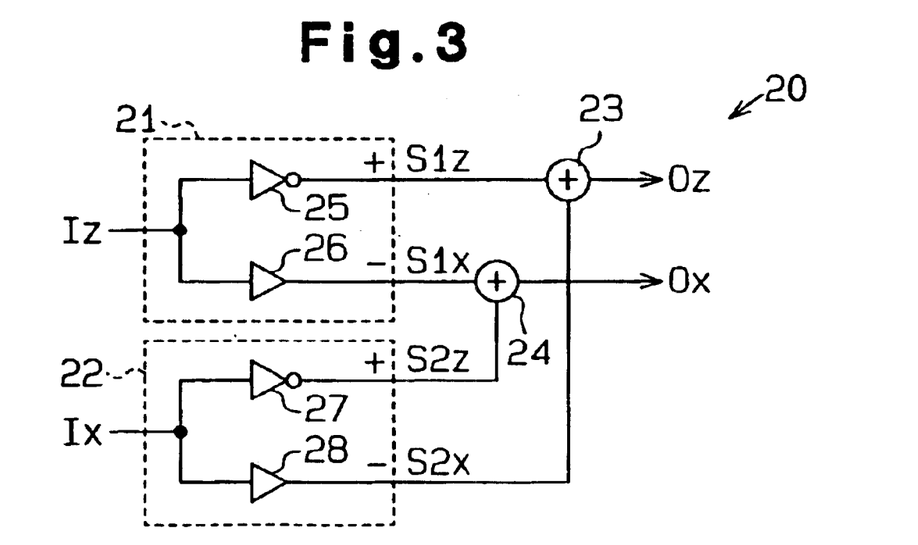
FIG. 3 is a schematic circuit diagram of the differential amplifier of FIG. 2.

As shown in FIG. 3, the first differential converter 21 includes a grounded emitter amplifier 25 and a grounded base amplifier 26. The amplifiers 25, 26 receive a first input signal Iz, and respectively generate first differential output signals S1z, S1x having reverse phases by operating in a reverse phase manner to the first input signal Iz.

The second differential converter 22 includes a grounded emitter amplifier 27 and a grounded base amplifier 28. The amplifiers 27, 28 receive a second input signal Ix, and respectively generate second differential output signals S2z, S2x having reverse phases by operating in a reverse phase manner to the second input signal Ix.

It is preferable that the grounded emitter amplifiers 25, 27 and the grounded base amplifiers 26, 28 are formed adjacently on a single semiconductor substrate so that these pairs have the same electric characteristics.

Next, the operation of the differential amplifier 20 will be described.

The input signals Iz, Ix are given by the following equations (1).

$$Iz = \sin(\omega t) \quad (1)$$
$$Ix = p \times \sin(\omega t + \pi + \phi)$$

Here, p represents a relative amplitude error between the first and second input signals Iz, Ix; and $\phi$ represents a phase error between the first and second input signals Iz, Ix.

The differential output signals S1z, S1x of the first differential converter 21 are given by the following equations (2).

$$S1z = A \times \sin(\omega t) \quad (2)$$
$$S1x = A \times k \times \sin(\omega t + \pi + \theta)$$

Here, k represents an amplitude error between the first and second output signals S1z, S1x; $\theta$ represents a phase error, and A represents a gain.

The differential output signals S2z, S2x of the second differential converter 22 are given by the following equations (3).

$$S2z = A \times p \times \sin(\omega t + \pi + \phi) \quad (3)$$
$$S2x = A \times k \times \sin(\omega t + \pi + \phi + \pi + \theta)$$

Therefore, the output signals Oz, Ox generated by the cross-coupling are given by the following equations (4)

$$Oz = A \times (\sin(\omega t) + k \times p \times \sin(\omega t + \pi + \phi)) \quad (4)$$
$$Ox = A \times (k \times \sin(\omega t + \pi + \theta) + p \times \sin(\omega t + \pi + \phi))$$

The amplitude error k(o) of the output signals Oz, Ox are given by the following equation (5).

$$K(o) = \frac{\sqrt{(1 + k \times p \times \cos(\phi + \theta))^2 + (k \times p \times \sin(\phi + \theta))^2}}{\sqrt{(k \times \cos\theta + p \times \cos\phi)^2 + (k \times \sin\theta + p \times \sin\phi)^2}} \quad (5)$$

The phase error φ(o) is given by the following equation (6).

$$\theta(o) = \tan^{-1}\left(\frac{k \times \sin\theta + p \times \sin\phi}{k \times \cos\theta + p \times \cos\phi}\right) - \quad (6)$$

$$= \tan^{-1}\left(\frac{k \times p \times \sin(\phi + \theta)}{1 + k \times p \times \cos(\phi + \theta)}\right)$$

Assuming that the amplitude error p=1.2 (20% error), the phase error φ=+20° of the input signals, the amplitude error k=1.05 (5% error), and the phase error θ=+5° of the differential converters, the calculation results of the amplitude error k(o) and the phase error φ(o) of the output signals are k(o)=1.01 (1% error) and φ(o)=-0.96°. Thus, the amplitude error and phase error of the output signals Oz, Ox are improved to an unquestionable degree, in comparison with the amplitude error and phase error of the input signals Iz, Ix.

In the above embodiment, the grounded emitter amplifiers 25, 27 with the single-end configuration do not perform a bias current switching; however, when relatively high-level input signals are supplied, they increase the bias current according to the self-biasing effect by the input signals (AB-class operation). As a result, the grounded emitter amplifiers 25, 27 delay the time until the output power (current) of the grounded emitter amplifiers 25, 27 reaches a saturation point, in comparison with a saturation reach time of the conventional emitter coupled differential amplifier. Therefore, the linearity of the output signals S1z, S1x is improved, and furthermore, the power efficiency is also improved.

The differential output signals S1z, S1x of the first differential converter 21 and the differential output signals S2z, S2x of the second differential converter 22 are cross-coupled, such that the balance characteristic of the output signals Oz, Ox is improved. Therefore, the differential amplifier 20 generates the complementary output signals Oz, Ox that have improved linearity and balance.

Figure 4:
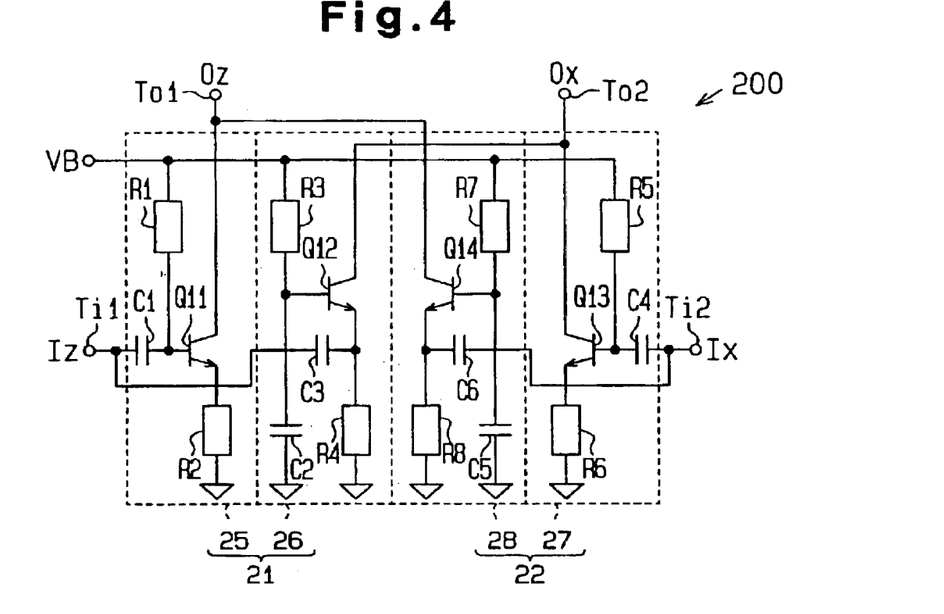
FIG. 4 is a circuit diagram of the differential amplifier according to the first embodiment of the present invention.

FIG. 4 is a circuit diagram of a differential amplifier 200.

The differential amplifier 200 includes first and second differential converters 21, 22. The grounded emitter amplifier 25 of the first differential converter 21 includes an NPN transistor Q11, resistors R1, R2, and a capacitor C1. A bias voltage VB is applied to the base of the transistor Q11 via the resistor R1, and the emitter of the transistor Q11 is connected to the ground via the resistor R2. The base of the transistor Q11 is connected to a first input terminal Ti1 via the DC decoupling capacitor C1, and the collector of the transistor Q11 is connected to a first output terminal To1.

The grounded base amplifier 26 of the first differential converter 21 includes an NPN transistor Q12, resistors R3, R4, and capacitors C2, C3. The base of the transistor Q12 is connected to the ground via the capacitor C2, and the bias voltage VB is applied to the base of the transistor Q12 via the resistor R3. The emitter of the transistor Q12 is connected to the ground via the resistor R4. The emitter of the transistor Q12 is connected to the first input terminal Ti1 via the DC decoupling capacitor C3, and the collector of the transistor Q12 is connected to a second output terminal To2.

The grounded emitter amplifier 27 of the second differential converter 22 includes an NPN transistor Q13, resistors R5, R6, and a capacitor C4. The bias voltage VB is applied to the base of the transistor Q13 via the resistor R5, and the emitter of the transistor Q13 is connected to the ground via the resistor R6. The base of the transistor Q13 is connected to a second input terminal Ti2 via the DC decoupling capacitor C4, and the collector of the transistor Q13 is connected to the second output terminal To2.

The grounded base amplifier 28 of the second differential converter 22 includes an NPN transistor Q14, resistors R7, R8, and capacitors C5, C6. The base of the transistor Q14 is connected to the ground via the capacitor C5, and the bias voltage VB is applied to the base of the transistor Q14 via the resistor R7. The emitter of the transistor Q14 is connected to the ground via the resistor R8, and also connected to the second input terminal Ti2 via the DC decoupling capacitor C6. The collector of the transistor Q14 is connected to the first output terminal To1.

The resistors R2, R4, R6, R8 determine the gains of the amplifiers 25, 26, 27, 28, respectively. The capacitors C2, C5 are capacitances between each of the respective bases and the ground.

The collector of the transistor Q11 and the collector of the transistor Q14 are connected, and the connection node of these two collectors is connected to the first output terminal To1. Accordingly, the output signal of the first grounded emitter amplifier 25 and the output signal of the second grounded base amplifier 28 are added to produce an output signal Oz.

The collector of the transistor Q12 and the collector of the transistor Q13 are connected, and the connection node of these two collectors is connected to the second output terminal To2. Accordingly, the output signal of the first grounded base amplifier 26 and the output signal of the second grounded emitter amplifier 27 are added to produce an output signal Ox. Therefore, the adders 23 and 24 in FIG. 3 and FIG. 2 become unnecessary.

The differential amplifiers 20 and 200 in the first embodiment have the following advantages.

The differential amplifier 20 is provided with the first differential converter 21 that includes the grounded emitter amplifier 25 and the grounded base amplifier 26, and the second differential converter 22 that includes the grounded emitter amplifier 27 and the grounded base amplfier 28. The differential amplifier 20 generates the differential output signals Oz, Ox by cross-coupling the differential output signals S1z, S1x, S2z, S2x of the amplifiers 25 through 28. As a result, the balance of the differential output signals Oz, Ox is improved. Furthermore, the linearity of the differential output signals Oz, Ox is improved by using the grounded emitter type amplifiers 25, 27.

The first embodiment may be modified as follows.

The configuration of the amplifiers 25 through 28 may be appropriately modified.

Figure 5:
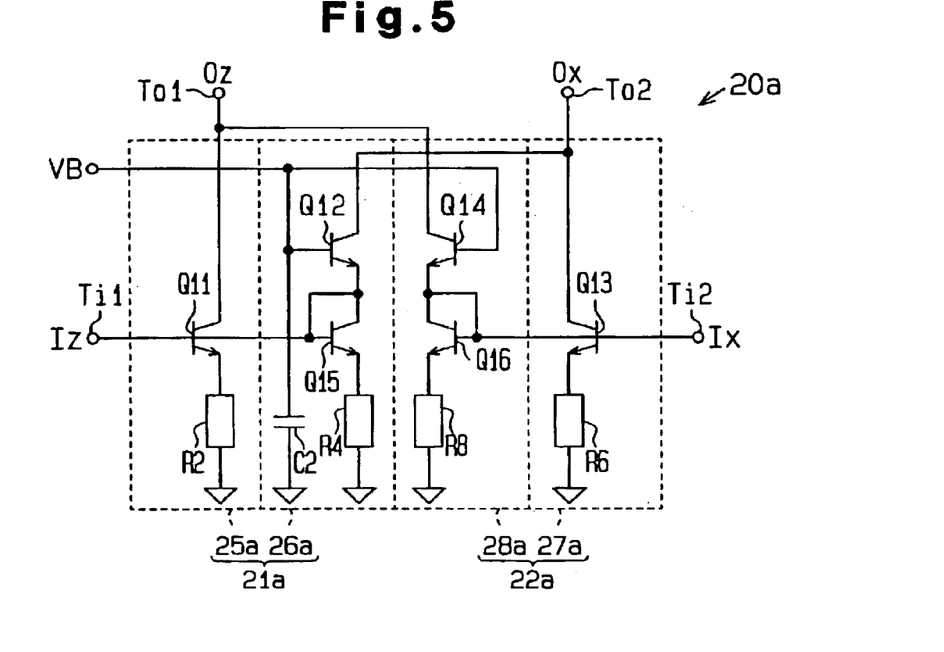
FIG. 5 is a circuit diagram illustrating a first alternative example of the differential amplifier of FIG. 4.

In a first alternative example as shown in FIG. 5, a differential amplifier 20a includes first and second differential converters 21a, 22a. The first differential converter 21a includes a grounded emitter amplifier 25a and a grounded base amplifier 26a. The second differential converter 22a includes a grounded emitter amplifier 27a and a grounded base amplifier 28a.

The grounded emitter amplifier 25a includes an NPN transistor Q11 and a resistor R2. The emitter of the transistor Q11 is connected to the ground via the resistor R2, and the input signal Iz is applied to the base of the transistor Q11.

The grounded base amplifier 26a includes NPN transistors Q12, Q15, a resistor R4, and a capacitor C2. The bias voltage VB is applied to the base of the transistor Q12, which is thereof connected to the ground via the capacitor C2. The emitter of the transistor Q12 is connected to the ground via the resistor R4. The transistor Q15 is connected between the transistor Q12 and the resistor R4. The collector of the transistor Q15 is connected to the emitter of the transistor Q12, and the emitter of the transistor Q15 is connected to the resistor R4. The base and collector of the transistor Q15 are connected to each other, and the base of the transistor Q15 is connected to the base of the transistor Q11 of the grounded emitter amplifier 25a.

The grounded emitter amplifier 27a includes an NPN transistor Q13 and a resistor 6, which are connected in the same manner as in the case of the grounded emitter amplifier 25a.

The grounded base amplifier 28a includes NPN transistors Q14, Q16, a resistor R8, and the capacitor C2, which are connected in the same manner as in the case of the grounded base amplifier 26a. Note that the capacitor C2 is shared by the grounded base amplifiers 26a and 28a.

In the grounded base amplifiers 26a and 28a, the bias voltage applied to the bases of the transistors Q15, Q16 is determined by the current that flows through the transistors Q12, Q14. The bias voltage to the transistors Q12, Q14 is also applied to the bases of the transistors Q11, Q13. Therefore, the resistors R1, R3, R5, R7 and the DC decoupling capacitors C1, C3, C4, C6 in FIG. 4 are no longer necessary.

Figure 6:
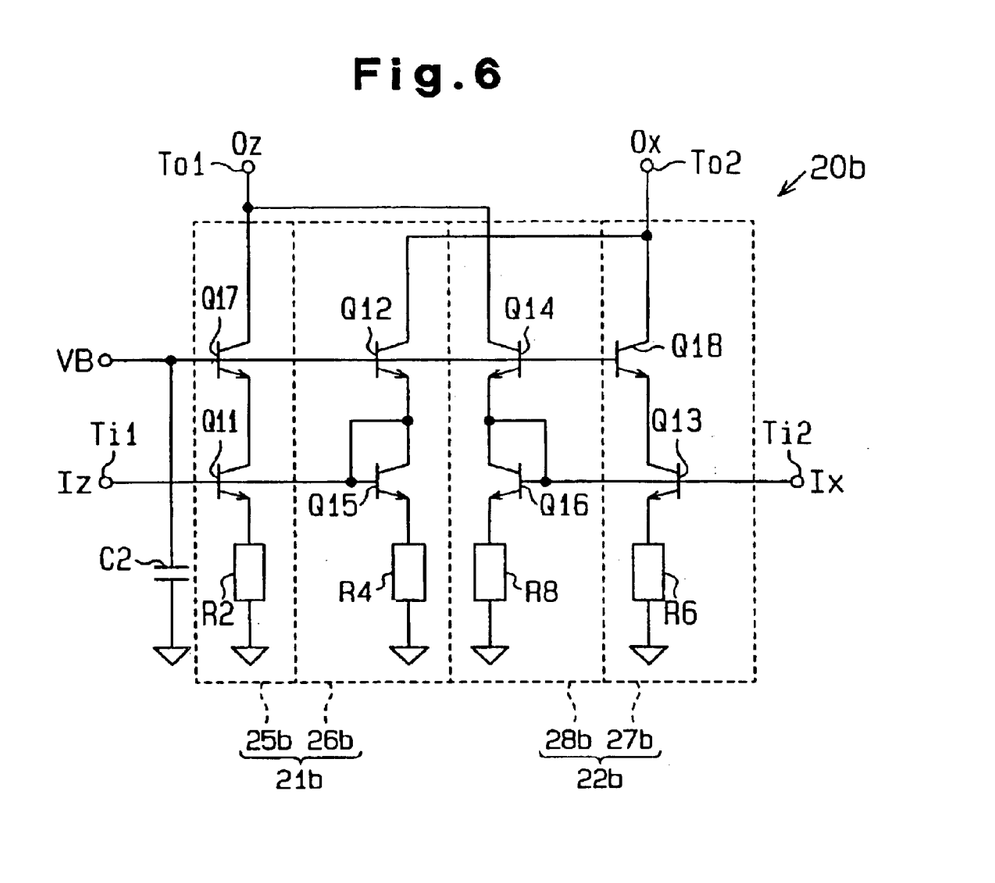
FIG. 6 is a circuit diagram illustrating a second alternative example of the differential amplifier of FIG. 4.

In a second alternative example as shown in FIG. 6, a differential amplifier 20b includes first and second differential converters 22b, 22b. The first differential converter 21b includes a grounded emitter amplifier 25b and a grounded base amplifier 26b. The second differential converter 22b includes a grounded emitter amplifier 27b and a grounded base amplifier 28b.

The grounded emitter amplifier 25b includes NPN transistors Q11, Q17 and a resistor R2. The emitter of the transistor Q11 is connected to the ground via the resistor R2, and the input signal Iz is applied to the base of the transistor Q11. The transistor Q17 is connected between the transistor Q11 and the output terminal To1. The emitter of the transistor Q17 is connected to the collector of the transistor Q11, and the collector of the transistor Q17 is connected to the output terminal To1. The bias voltage VB is applied to the base of the transistor Q17.

The grounded base amplifier 26b includes NPN transistors Q12, Q15, a resistor R4, and a capacitor C2. The bias voltage VB is applied to the base of the transistor Q12, which is thereof connected to the ground via the capacitor C2. The transistor Q15 is connected between the transistor Q12 and the resistor R4. The collector of the transistor Q15 is connected to the emitter of the transistor Q12, and the emitter of the transistor Q15 is connected to the ground via the resistor R4. The base and collector of the transistor Q15 are connected to each other, and the base of the transistor Q15 is connected to the base of the transistor Q11 of the grounded emitter amplifier 25b.

The grounded emitter amplifier 27b includes NPN transistors Q13, Q18 and a resistor R6, which are connected in the same manner as in the case of the grounded emitter amplifier 25b.

The grounded base amplifier 28b includes NPN transistors Q14, Q16, a resistor R8, and the capacitor C2, which are connected in the same manner as in the case of the grounded base amplifier 26b.

In the differential amplifier 20b, the resistors R1, R3, R5, R7 and the DC decoupling capacitors C1, C3, C4, C6 are no longer necessary, thereby reducing the circuit size. Furthermore, the grounded emitter amplifiers 25b, 27b are in a cascaded configuration, thereby improving the balance of the differential amplifier.

Figure 7:
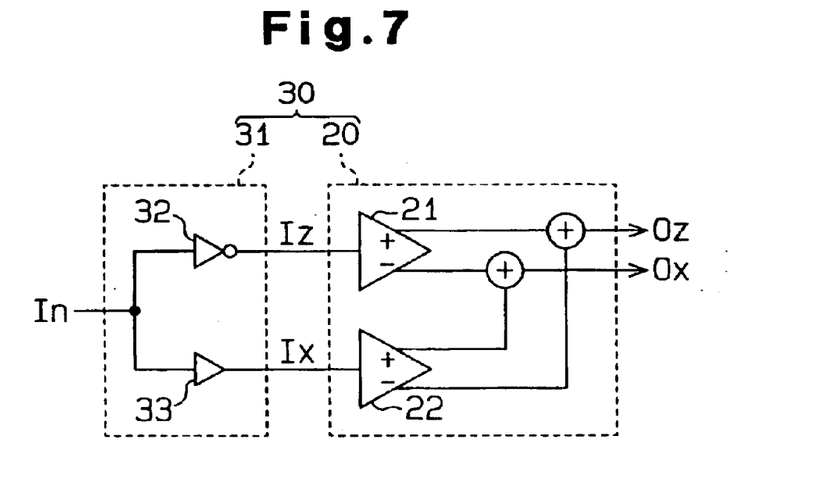
FIG. 7 is a schematic circuit diagram of a single-end differential converter according to a second embodiment of the present invention.

As shown in FIG. 7, a single-end differential converter 30 according to a second embodiment of the present invention includes an input-stage differential converter 31 and the differential amplifier 20 of FIG. 2. The differential amplifier 200 of FIG. 4, the differential amplifier 20a of FIG. 5, or the differential amplifier 20b of FIG. 6 may alternatively replace the differential amplifier 20. The differential converter 31 includes a base-input grounded emitter amplifier 32 and an emitter-input grounded base amplifier 33. The amplifier 32 receives an input signal In to generate a differential output signal Iz. The amplifier 33 receives the input signal In to generate a differential output signal Ix.

Since the single-end differential converter 30 includes the differential amplifier 20, the output signals Oz, Ox with the improved linearity and balance are generated.

Figure 8:
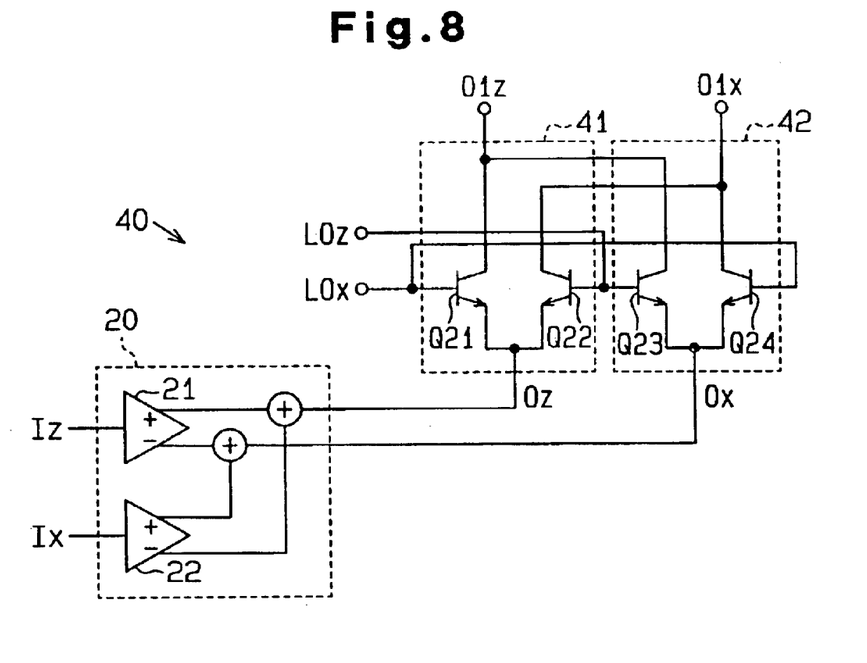
FIG. 8 is a schematic circuit diagram of a differential input type mixer according to a third embodiment of the present invention.

As shown in FIG. 8, a differential input type mixer 40 according to a third embodiment of the present invention includes the differential amplifier 20 and two differential circuits 41, 42. That is, the differential input type mixer 40 can be taken as a system in which the differential amplifier 20 replaces a differential pair in a Gilbert-Cell mixer. The differential amplifier 200 of FIG. 4, the differential amplifier 20a of FIG. 5, or the differential amplifier 20b of FIG. 6 may alternatively replace the differential amplifier 20.

The first differential circuit 41 receives carrier signals Loz, Lox to generate first complementary differential output signals based on the output signal Oz of the differential amplifier 20. The second differential circuit 42 receives the carrier signals Loz, Lox to generate second complementary differential output signals based on the output signal Ox of the differential amplifier 20. The first complementary differential output signals and the second complementary differential output signals are cross-coupled, thereby generating mixer output signals O1z, O1x in which the input signals Iz, Ix are mixed with the carrier signals Loz, Lox.

The first differential circuit 41 includes emitter coupled NPN transistors Q21, Q22. The output signal Oz of the differential amplifier 20 is supplied to the emitters of the transistors Q21, Q22. The carrier signals Loz, Lox are supplied to the bases of the transistors Q21, Q22 respectively.

The second differential circuit 42 includes emitter coupled NPN transistors Q23, Q24. The output signal Ox of the differential amplifier 20 is supplied to the emitters of the transistors Q23, Q24. The carrier signals Loz, Lox are supplied to the bases of the transistors Q23, Q24 respectively.

The output signals of the first and second differential circuits 41, 42 are cross-coupled, and the mixer circuit 40 generates the mixer output signals O1z, O1x in which the input signals Iz, Ix are mixed with the carrier signals Loz, Lox. Thus, the mixer circuit 40 has improved balance, and generates the mixer output signal O1z, O1x that have improved linearity and balance.

Figure 9:
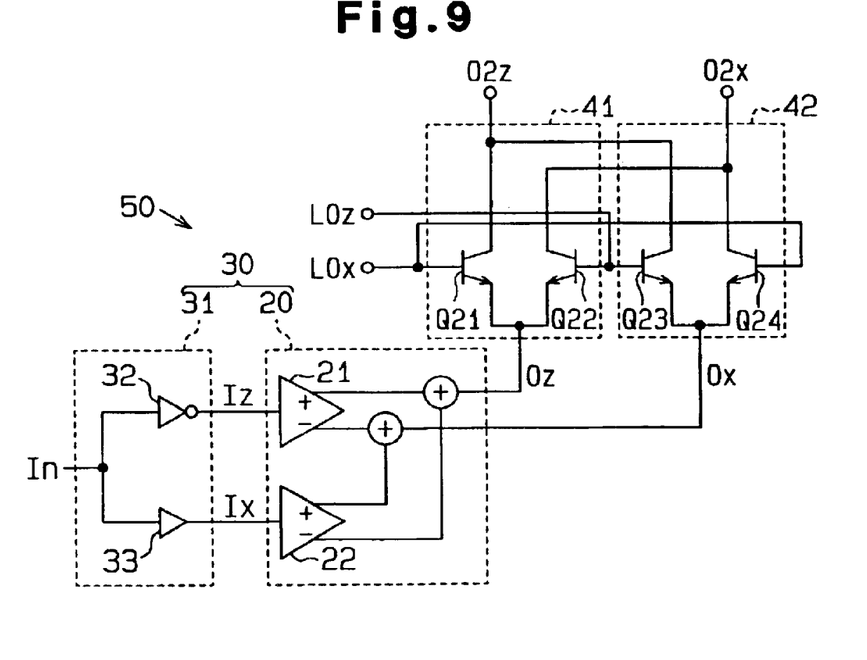
FIG. 9 is a schematic circuit diagram of a single-end input type mixer according to a fourth embodiment of the present invention.

As shown in FIG. 9, a single-end input type mixer 50 according to a fourth embodiment of the present invention includes the differential converter 30 and the two differential circuits 41, 42. The differential converter 30 includes the differential inversion section 31 and the differential amplifier 20 (of FIG. 2). That is, the single-end input type mixer 50 can be taken as a system in which the single-end input type differential converter 30 of FIG. 7 replaces a differential pair in a Gilbert-Cell mixer.

The mixer 50 does not need the balun that generates the differential signals. Therefore, even if the input signal In has a relatively broad frequency band, the mixer 50 generates output signals O2z, O2x having improved balance and linearity.

It should be apparent to those skilled in the art that the present invention may be embodied in many other specific forms without departing from the principle and the scope of the invention. Particularly, it should be understood that the invention may be embodied in the following forms.

The NPN transistors may be replaced by PNP bipolar transistors or FETs.

Therefore, the present examples and embodiments are to be considered as illustrative and not restrictive and the invention is not to be limited to the details given herein, but may be modified within the scope and equivalence of the appended claims.

What is claimed is:

1. A differential amplifier that receives first and second input signals and generates first and second output signals, the differential amplifier comprising:
   a first differential converter including a first grounded emitter amplifier that receives the first input signal and generates a first differential output signal, and a first grounded base amplifier that receives the first input signal and generates a second differential output signal; and
   a second differential converter including a second grounded emitter amplifier that receives the second input signal and generates a third differential output signal, and a second grounded base amplifier that receives the second input signal and generates a fourth differential output signal;
   wherein the first output signal is generated by coupling the first differential output signal and the fourth differential output signal, and the second output signal is generated by coupling the second differential output signal and the third differential output signal,
   wherein the first grounded emitter amplifier includes: a first transistor,
      a first resistor connected between an emitter of the first transistor and a ground,
      a first capacitor connected to a base of the first transistor, for receiving the first input signal, and
      a second resistor connected between the base of the first transistor and a bias voltage;
   the first grounded base amplifier includes:
      a second transistor,
      a second capacitor connected between a base of the second transistor and the ground,
      a third resistor connected between the base of the second transistor and the bias voltage,
      a third capacitor connected to an emitter of the second transistor, for receiving the first input signal, and
      a fourth resistor connected between the emitter of the second transistor and the ground;
   the second grounded emitter amplifier includes:
      a third transistor,
      a fifth resistor connected between an emitter of the third transistor and the ground,
      a fourth capacitor connected to a base of the third transistor, for receiving the second input signal, and
      a sixth resistor connected between the base of the third transistor and the bias voltage; and
   the second grounded base amplifier includes:
      a fourth transistor,
      a fifth capacitor connected between a base of the fourth transistor and the ground,
      a seventh resistor connected between the base of the fourth transistor and the bias voltage,
      a sixth capacitor connected to an emitter of the fourth transistor, for receiving the second input signal, and
      an eighth resistor connected between the emitter of the fourth transistor and the ground;
      wherein a collector of the first transistor is connected to a collector of the fourth transistor, and a collector of the second transistor is connected to a collector of the third transistor.

2. A differential amplifier that receives first and second input signals and generates first and second output signals, the differential amplifier comprising:
   a first differential converter including a first grounded emitter amplifier that receives the first input signal and generates a first differential output signal, and a first grounded base amplifier that receives the first input signal and generates a second differential output signal; and
   a second differential converter including a second grounded emitter amplifier that receives the second input signal and generates a third differential output signal, and a second grounded base amplifier that receives the second input signal and generates a fourth differential output signal;
   wherein the first output signal is generated by coupling the first differential output signal and the fourth differential output signal, and the second output signal is generated by coupling the second differential output signal and the third differential output signal,
   wherein the first grounded emitter amplifier includes:
      a first transistor, a base of which receives the first input signal, and
      a first resistor connected between an emitter of the first transistor and a ground;
   the first grounded base amplifier includes:
      a second transistor,
      a first capacitor connected between a base of the second transistor and the ground,
      a third transistor, a collector of which is connected to an emitter of the second transistor, and a base of which is connected to its own collector and receives the first input signal, and
      a second resistor connected between an emitter of the third transistor and the ground;
   the second grounded emitter amplifier includes:
      a fourth transistor, a base of which receives the second input signal, and
      a third resistor connected between an emitter of the fourth transistor and the ground; and
   the second grounded base amplifier includes:
      a fifth transistor, a base of which is connected to the ground via the first capacitor,
      a sixth transistor, a collector of which is connected to an emitter of the fifth transistor, and a base of which is connected to its own collector and receives the second input signal, and
      a fourth resistor connected between an emitter of the sixth transistor and the ground;
   wherein a collector of the first transistor is connected to a collector of the fifth transistor, and a collector of the second transistor is connected to a collector of the fourth transistor.

3. A differential amplifier that receives first and second input signals and generates first and second output signals, the differential amplifier comprising:
- a first differential converter including a first grounded emitter amplifier that receives the first input signal and generates a first differential output signal, and a first grounded base amplifier that receives the first input signal and generates a second differential output signal; and
- a second differential converter including a second grounded emitter amplifier that receives the second input signal and generates a third differential output signal, and a second grounded base amplifier that receives the second input signal and generates a fourth differential output signal;
- wherein the first output signal is generated by coupling the first differential output signal and the fourth differential output signal, and the second output signal is generated by coupling the second differential output signal and the third differential output signal,
- wherein the first grounded emitter amplifier includes:
  - a first transistor, a base of which receives the first input signal,
  - a first resistor connected between an emitter of the first transistor and a ground, and
  - a second transistor, an emitter of which is connected to a collector of the first transistor;
- the first grounded base amplifier includes:
  - a third transistor,
  - a first capacitor connected between a base of the third transistor and the ground,
  - a fourth transistor, a collector of which is connected to an emitter of the third transistor, and a base of which is connected to its own collector and receives the first input signal, and
  - a second resistor connected between the emitter of the third transistor and the ground;
- the second grounded emitter amplifier includes:
  - a fifth transistor, a base of which receives the second input signal, and
  - a sixth transistor, an emitter of which is connected to a collector of the fifth transistor; and
- the second grounded base amplifier includes:
  - a seventh transistor, a base of which is connected to the ground via the first capacitor,
  - an eighth transistor, a collector of which is connected to an emitter of the seventh transistor, and a base of which is connected to its own collector and receives the second input signal, and
  - a fourth resistor connected between an emitter, of the eighth transistor and the ground
- wherein a collector of the second transistor is connected to a collector of the seventh transistor, and a collector of the third transistor is connected to a collector of the sixth transistor.

4. A differential converter comprising:
- an input-stage differential converter including a first grounded emitter amplifier that receives an original input signal and generates a first differential input signal and a first grounded base amplifier that receives the original input signal and generates a second differential input signal; and
- a differential amplifier connected to the input-stage differential converter, for receiving the first and second differential input signals and generating first and second output signals, wherein the differential amplifier includes:
  - a first output-stage differential converter including a second grounded emitter amplifier that receives the first differential input signal and generates a first differential output signal, and a second grounded base amplifier that receives the first differential input signal and generates a second differential output signal, and
  - a second output-stage differential converter including a third grounded emitter amplifier that receives the second differential input signal and generates a third differential output signal, and a third grounded base amplifier that receives the second differential input signal and generates a fourth differential output signal, wherein the first output signal is generated by coupling the first differential output signal and the fourth differential output signal, and the second output signal is generated by coupling the second differential output signal and the third differential output signal.

5. A mixer that mixes an original input signal with first and second carrier signals to generate first and second mixer output signals, the mixer comprising:
- an input-stage differential converter including a first grounded emitter amplifier that receives the original input signal and generates a first differential input signal, and a first grounded base amplifier that receives the original input signal and generates a second differential input signal;
- a differential amplifier connected to the input-stage differential converter, for receiving the first and second differential input signals and generating first and second output signals, wherein the differential amplifier includes,
  - a first output-stage differential converter including a second grounded emitter amplifier that receives the first differential input signal and generates a first differential output signal, and a second grounded base amplifier that receives the first differential input signal and generates a second differential output signal, and
  - a second output-stage differential converter including a third grounded emitter amplifier that receives the second differential input signal and generates a third differential output signal, and a third grounded base amplifier that receives the second differential input signal and generates a fourth differential output signal, wherein the first output signal is generated by coupling the first differential output signal and the fourth differential output signal, and the second output signal is generated by coupling the second differential output signal and the third differential output signal; and
- a pair of differential circuits connected to the differential amplifier, for receiving the first and second output signals and the first and second carrier signals to generate the first and second mixer output signals.

* * * * *

UNITED STATES PATENT AND TRADEMARK OFFICE
CERTIFICATE OF CORRECTION

PATENT NO. : 6,927,629 B2
DATED : August 9, 2005
INVENTOR(S) : Tomita

It is certified that error appears in the above-identified patent and that said Letters Patent is hereby corrected as shown below:

<u>Title page, Item [54] and Column 1, lines 1-2,</u>
Title, please change the title to read as follows:
-- DIFFERENTIAL AMPLIFIER HAVING IMPROVED BALANCE AND LINEARITY --.

Signed and Sealed this

Twenty-second Day of November, 2005

JON W. DUDAS
*Director of the United States Patent and Trademark Office*